US009188744B1

(12) United States Patent
Peng et al.

(10) Patent No.: US 9,188,744 B1
(45) Date of Patent: Nov. 17, 2015

(54) MULTIMODE OPTICAL TAP FILTERS WITHOUT DISPERSION FOR HIGH-SPEED DATA COMMUNICATIONS

(71) Applicant: Alliance Fiber Optic Products, Inc., Sunnyvale, CA (US)

(72) Inventors: Bruce Peng, Fremont, CA (US); Yao Li, Newark, CA (US)

(73) Assignee: Alliance Fiber Optic Products, Inc., Sunnyvale, CA (US)

( * ) Notice: Subject to any disclaimer, the term of this patent is extended or adjusted under 35 U.S.C. 154(b) by 106 days.

(21) Appl. No.: 13/913,480

(22) Filed: Jun. 9, 2013

Related U.S. Application Data

(60) Provisional application No. 61/689,623, filed on Jun. 11, 2012.

(51) Int. Cl.
*H01S 5/12* (2006.01)
*G02B 6/293* (2006.01)
*H01S 5/14* (2006.01)
*H01S 3/30* (2006.01)
*G02B 3/00* (2006.01)

(52) U.S. Cl.
CPC .......... *G02B 6/29379* (2013.01); *G02B 3/0056* (2013.01); *G02B 3/0087* (2013.01); *G02B 6/2938* (2013.01); *G02B 6/29395* (2013.01); *H01S 3/302* (2013.01); *H01S 5/12* (2013.01); *H01S 5/141* (2013.01)

(58) Field of Classification Search
CPC ............. G02B 6/2938; G02B 6/29305; G02B 3/0056; G02B 3/0087; H01S 3/302; H01S 5/141; H01S 5/12
USPC ........... 385/17, 27, 28, 29, 30, 31, 39, 43, 50, 385/16, 24–26, 34; 372/3, 92, 96, 99; 359/652, 653, 654
See application file for complete search history.

(56) References Cited

U.S. PATENT DOCUMENTS

| 4,768,849 | A * | 9/1988 | Hicks, Jr. ......................... 385/30 |
| 4,798,436 | A * | 1/1989 | Mortimore ...................... 385/43 |
| 5,157,690 | A * | 10/1992 | Buttle ............................ 375/232 |
| 6,084,994 | A * | 7/2000 | Li et al. ........................... 385/31 |
| 2005/0201677 | A1* | 9/2005 | Wang et al. ..................... 385/28 |
| 2007/0189670 | A1* | 8/2007 | Nagata et al. ................... 385/48 |
| 2009/0257714 | A1* | 10/2009 | Zhang et al. .................... 385/34 |

* cited by examiner

*Primary Examiner* — Akm Enayet Ullah
(74) *Attorney, Agent, or Firm* — Joe Zheng

(57) ABSTRACT

Techniques for monitoring optical power, dispersion and mode distribution in high speed multimode fiber are described. According to one aspect of the present invention, a multimode optical tap filter is disclosed. The tap filter is dispersionless and tap ratio independent, and packaged in a 3-port form factor. To be efficient in cost, at least two such optical tab filters are packaged in one device while sharing a single thin film filter provided to reflect a predefined portion of a signal being monitored.

9 Claims, 9 Drawing Sheets

With non-symmetry splitting ratio mode dispersion between high modes & low modes at high speed is even larger (10Gbps above)

MULTIMODE OPTICAL TAP FILTERS WITHOUT DISPERSION FOR HIGH-SPEED DATA COMMUNICATIONS

CROSS-REFERENCE TO RELATED APPLICATION

This application claims the benefits of U.S. Provisional Application No. 61/689,623, filed Jun. 11, 2012, and entitled the same, which is hereby incorporated by reference for all purposes.

BACKGROUND OF THE INVENTION

1. Field of the Invention

The invention is generally related to the area of optical communications. In particular, the invention is related to dispersionless multimode optical tap filters.

2. The Background of Related Art

To meet the ever-increasing demands for high bandwidth and more flexibility in modern communication networks, utilizing optical fiber networks capable of transmitting multiplexed channel signals is becoming increasingly popular. Many optical devices have been designed to meet the demands. Practically, these demands are arising from three areas: 1) video traffic over the Internet, such as Netflix and Youtube etc., 2) mobile access via smart phones including voice over IP (VoIP), 3) cloud storage and rich media files migrating via the Internet. All these demands seem to boost considerably the requirements on the service provider and the booming of various data centers. To meet the higher speed requirement, service providers and data centers also need more flexible network devices or equipment to support debugging and monitoring of the signals originated from them.

The availability of vertical cavity surface emitting laser (VCSEL) technology facilitates high speed parallel data links that can transmit 12 to 24 parallel channels, each channel supporting more than 10 gigabit/sec (Gbps). VCSEL has recently been demonstrated for bandwidth even higher than 25 Gbps and promises ro provide low cost parallel data links among computers, storage devices and servers to form an aggregated data center. As networked computers and storage devices grow larger and larger in functions and complexities, monitoring the network becomes an essential task to ensure the communication quality and data integrity.

In the past, a data center used a conventional fuse coupler for tap monitoring function. An optical tap is essentially a 1×2 device, where a portion of the input signal is branched out to a photo-detector that converts the tapped signal to serve as a monitored signal. A fused coupler can be made for either a single-mode or a multimode fiber application. U.S. Pat. No. 4,798,436 discloses one type of optical fused couplers. US Pat. Pub. No.: 2005/0201677 teaches a multimode optical fiber coupler. FIG. 1 duplicates FIG. 2 of US Pat. Pub. No.: 2005/0201677 to show the structure of an exemplary multimode optical fiber coupler.

In a typical data center today, where the cost effectiveness is always concerned, a good portion of data links are supported by the VCSEL based multimode fibers. Thus, multimode fiber taps are becoming increasingly important. As the data rate goes higher, the fused optical coupler will have more mode oriented insertion loss degradation, especially for multimode fused coupler with non-symmetry tapping/splitting ratio. The degradation can be several dB in bit-error-rate (BER) testing. One of the causes for this issue may be explained as shown in FIG. 2.

FIG. 2 shows that lower order modes by low frequency sine wave curves can travel faster than higher order mode signal (shown as high frequency sine wave curves). Thus, a signal that enters a multimode tap coupler with both lower and higher order modes at the same time will experience a travel time difference between these modes when they traverse the coupler (as illustrated by small vertical bars in FIG. 2). The time difference between these modes is known as modal dispersion or the arrival time spread of the signal from A to B.

The model dispersion is a very serious impairment in a communication link as it limits the data bandwidth. The modal dispersion depends on a tap ratio. Other than a 50/50 splitting ratio among two output ports, they are different for various tap ratios as shown in FIG. 3. In other words, for a fused fiber coupler with 30/70 splitting ratio, the dispersions obtained from the two output ports are different. For data rate under 8 Gbps, the modal dispersion from tapping based on a fused coupler may not be a serious limit. But higher bandwidth data links such as 10 Gbps and beyond would not ignore this modal dispersion issue.

In addition to suffering from splitting or tapping ratio dependent modal dispersion, signal tapping based on multimode fiber fused couplers also has a tap ratio dependent mode distribution problems among the two output ports. Therefore, for high speed multimode fiber data links (typically>8 Gbps), one cannot use a fused tap coupler to accurately perform monitoring function for dispersion and mode health. A fused tap coupler can only be used to monitor the optical signal power.

The article "Simplified theory of the multimode fiber coupler", *The Bell System Technical Journal*, Vol. 56 No. 5, Page 729 describes that the root cause for mode dispersion and mode dependent loss issue is due to the complicated coupling coefficient, which previously people found that depending on mode order, coupling length and position etc. and the coupling coefficient can be described in the following equations:

$$|C_{A_iB_i}| = |C_{B_iA_i}| = \gamma \frac{\sqrt{2\Delta}}{\alpha} \frac{u^2}{v^3} \frac{|K_{2l}(wd/a)\cos(2l\alpha) \pm K_o(wd/a)|}{K_{l-1}(w)K_{l+1}(w)},$$

FIG. 4 duplicates the figure on page 729 of the article to show the effects. Those skilled in the art shall understand better after reviewing the article.

The present invention disclosure teaches a solution for monitoring optical power, dispersion and mode distribution in high speed multimode fiber communication. One embodiment of the present invention is a multimode optical tap filter that is dispersionless and tap ratio independent.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

In general, the present invention is related to monitoring optical power, dispersion and mode distribution in high speed multimode fiber. According to one aspect of the present invention, a multimode optical tap filter is described. It is dispersionless and tap ratio independent, and packaged in a 3-port form factor. To be efficient in cost, at least two such optical tab filters are packaged in one device while sharing a single thin film filter provided to reflect a predefined portion of a signal being monitored.

The present invention may be implemented as a method, an apparatus or a part of a system. According to one embodiment, the present invention is an optical tap filter package comprising: at least two individual optical tap filters sharing a single thin film tap filter, wherein each of the two individual optical tap filters includes an input port, a tapping port and an output port, the input port and the tapping port are on one side of the film tap filter and the output port is on another side of the film tap filter. The thin film tap filter is designed to reflect a predefined portion of an input signal received via the input port and pass a remaining portion of the input signal to the output port, wherein a ratio of the predefined portion over the remaining portion is less than 50%.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

In the following description, numerous specific details are set forth in order to provide a thorough understanding of the present invention. However, it will become obvious to those skilled in the art that the present invention may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 5-8. However, those skilled in the art will readily appreciate that the detailed description given herein with respect to these figures is for explanatory purposes as the invention extends beyond these limited embodiments.

Figure 1:
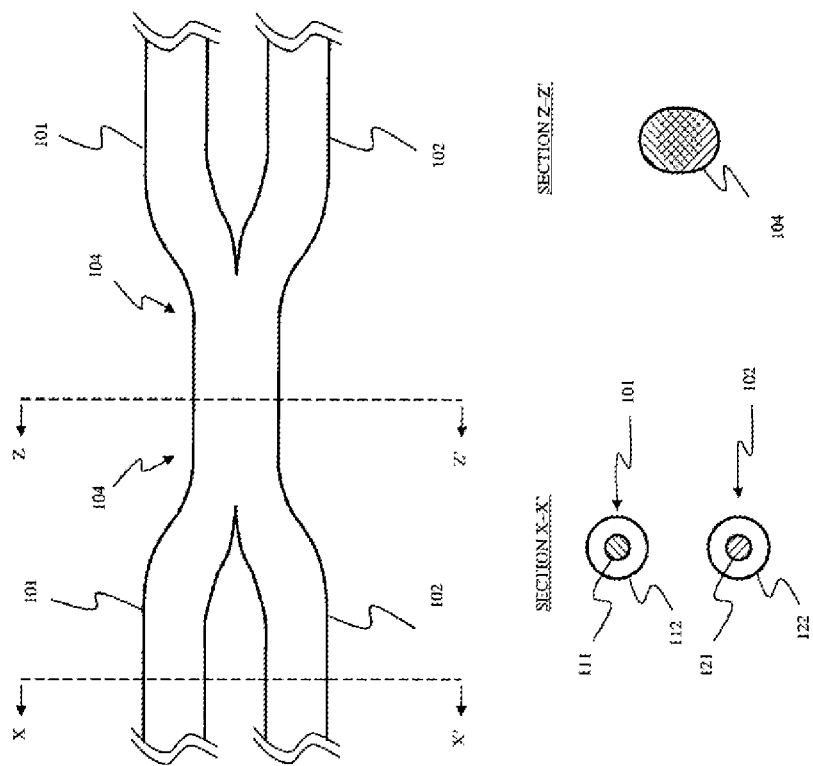
FIG. 1 duplicates FIG. 2 of US Pat. Pub. No.: 2005/0201677 to show the structure of an exemplary multimode optical fiber coupler.
Figure 2:
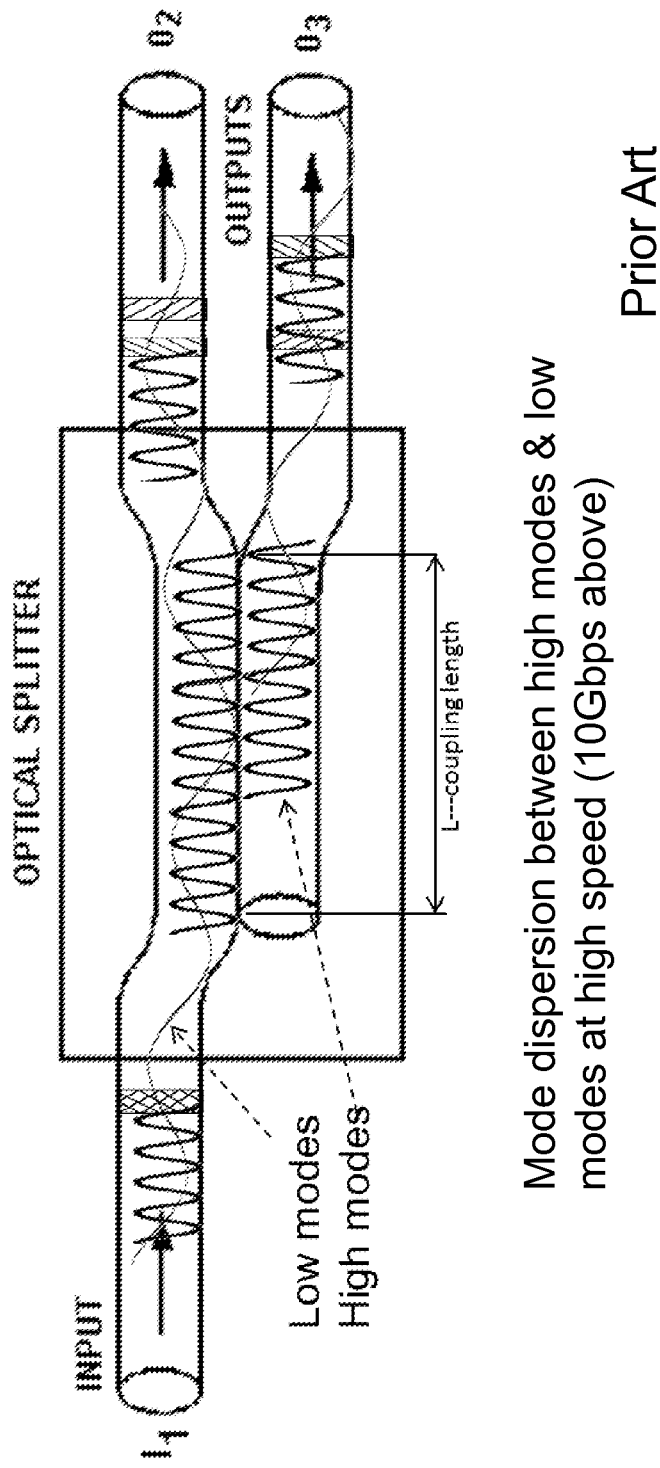
FIG. 2 shows a mode dispersion between high modes and low modes at high speed.
Figure 3:
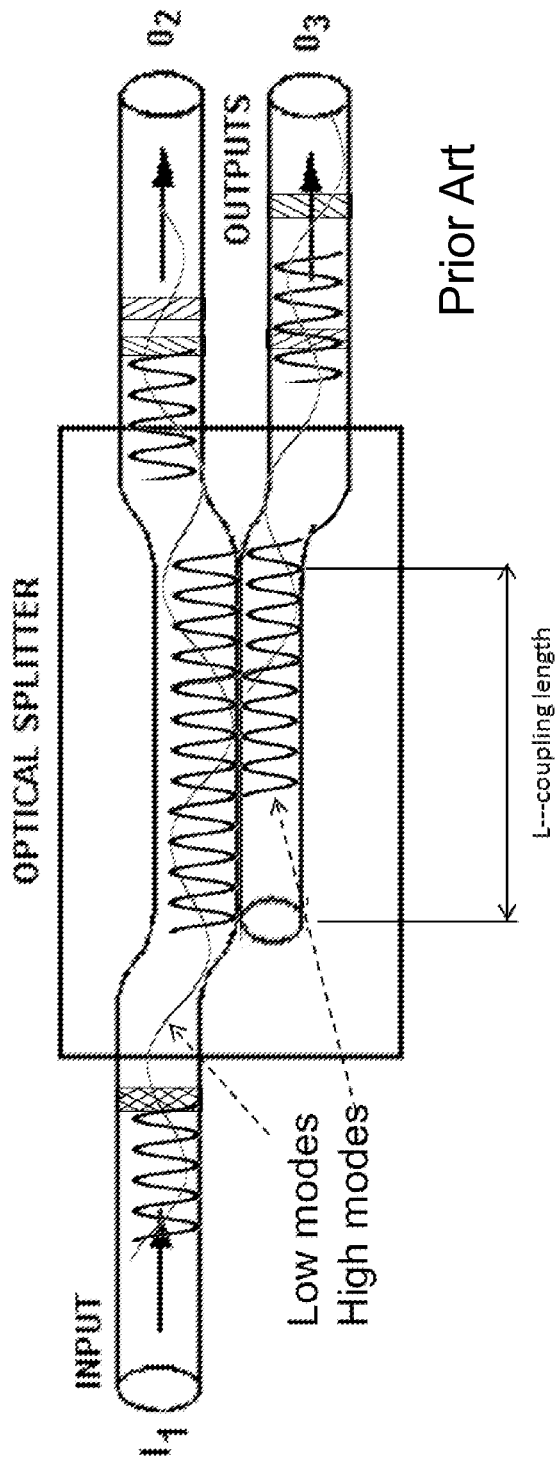
FIG. 3 shows a modal dispersion depending on a tap ratio, other than a 50/50 splitting ratio among two output ports, the modal dispersions are so different for various tap ratios.
Figure 4:
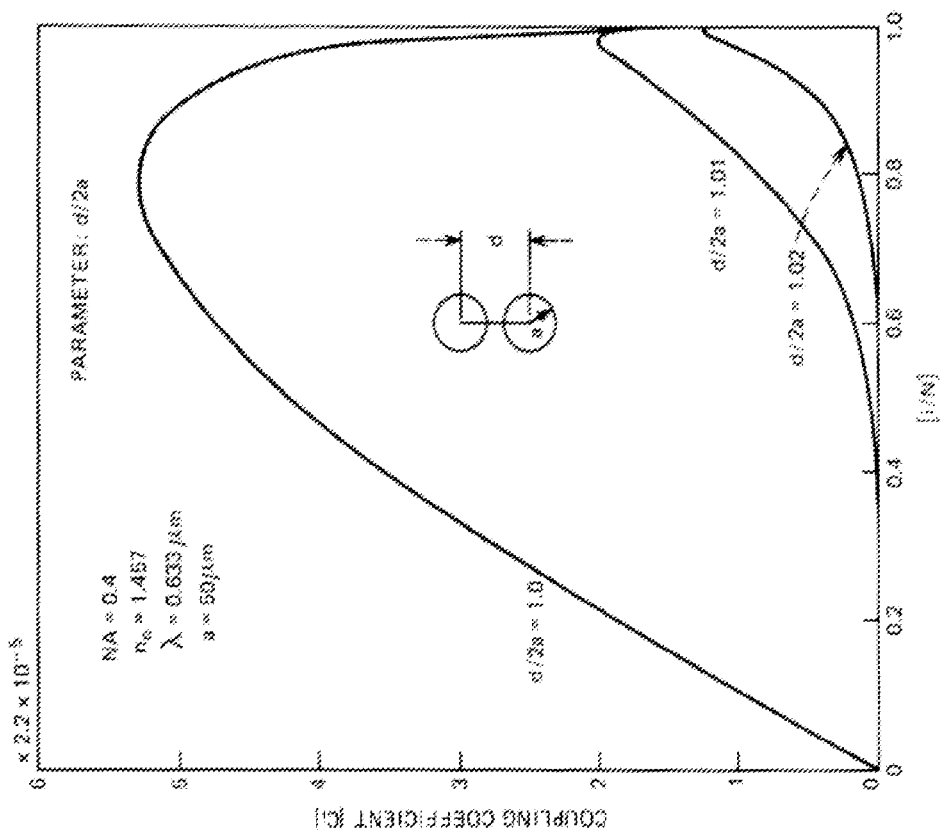
FIG. 4 duplicates a figure on page 729 of the article "Simplified theory of the multimode fiber coupler", *The Bell System Technical Journal*, Vol. 56 No. 5.
Figure 5:
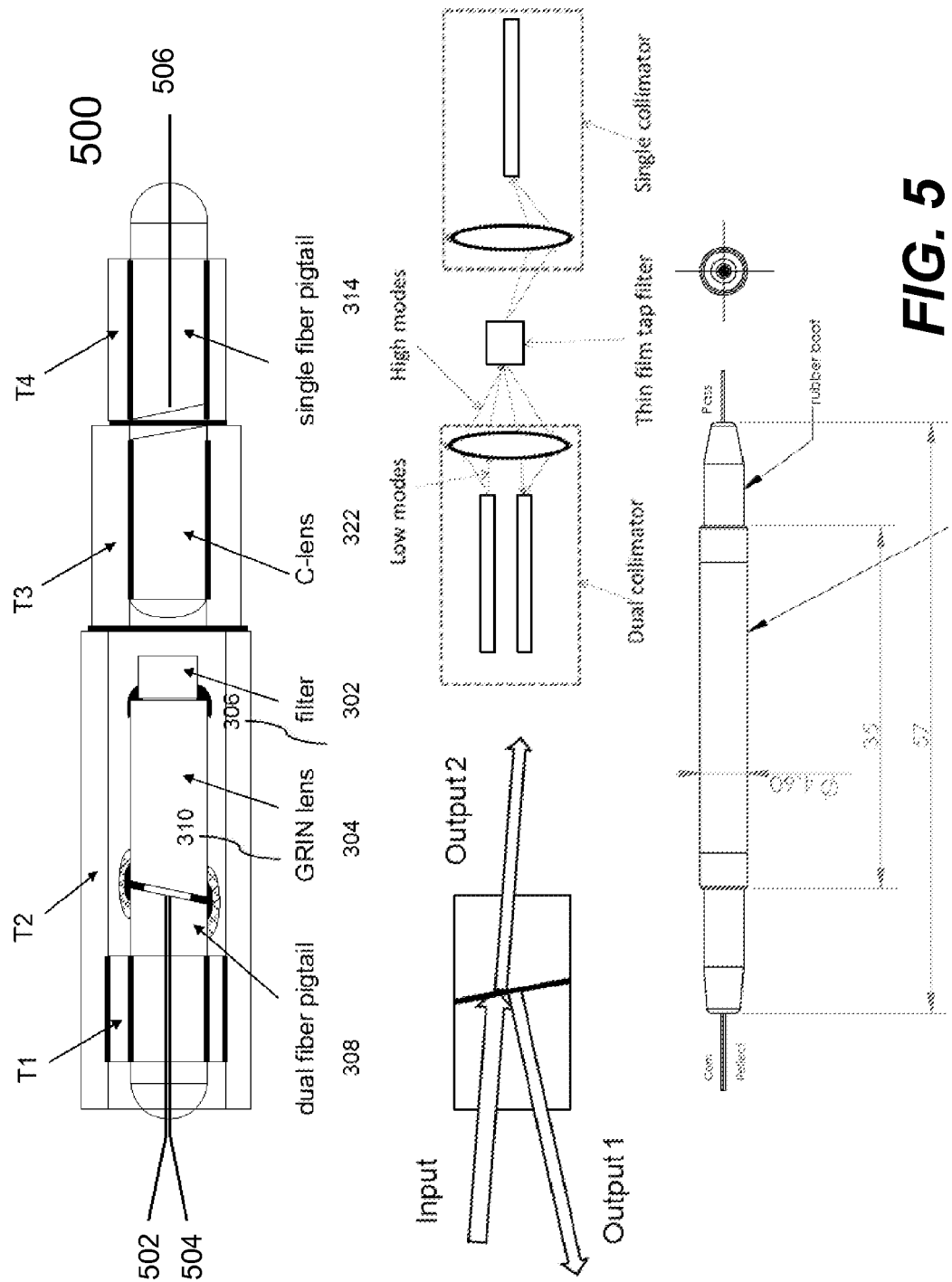
FIG. 5 shows a tap filter packaged as a 3-port optical device according to one embodiment of the present invention.

To provide a solution for high speed multimode fiber monitoring of optical power, dispersion and mode distribution, a dispersionless and tap ratio independent optical tap filter and a method of making the same are described. Referring now to the drawings, in which like numerals refer to like parts throughout the several views. FIG. 5 shows a tap filter packaged as a 3-port optical device according to one embodiment of the present invention. As is shown, the 3-port tap filter 500 includes an input port 502, and two output ports 504 and 506, where the input port 502 and the output port 504 are being supported by a dual-fiber pigtail 308, and the output port 506 is from a single fiber pigtail 314.

The tap filter 500 is based on a thin film coated optical power tap filter packaged in 3-port fiber device form factor. As the tapping occurs at the coated thin film interface 508 immediately without the transporting the coupling or mode order dependent coupling coefficient issues, the high modes and low modes are perfectly converged by the lens system (e.g., the GRIN lens 304 and C-lens 322). Operationally, this thin film tapping has no dispersion issue and is not dependent on the transporting speed and thus it is suitable for high speed (8 Gbps and above) application. Especially this thin film tap approach can work for non-symmetry tapping/splitting at high speed without the issues seen in the conventional fused couplers.

FIG. 5 further shows the components in operations. The thin film filter 302 acts as a partial mirror which is only sensitive to the optical signal of the designed wavelength, for example, an 850 nm region that is a typical wavelength for a VCSEL transmitter. Such a filter can be designed to possess a predefined splitting or tap ratio of 50/50, 30/70, 10/90 and etc. among its two output ports as illustrated in FIG. 5. In general such a filter will not generate any modal dispersion. To make a three port optical fiber device, this filter will need to be packaged in a disperless optical configuration as shown in FIG. 5. As the arrows indicated, the optical signals of the lower and higher order modes (represented by smaller or larger angle rays, respectively) emerging from the input fiber is guided by the lens system to the tap thin film filter 302. The signal is split into a reflective portion and a transmissive portion while the beams maintain the same angular relations that represent modes. While the reflective signal travels through the same input lens bottom portion, the transmissive signal passes a second optical lens before arriving at the destination fiber. The modes are all preserved and the travel time among all modes are the same, indicating no dispersion due to the well known lens imaging theory. Therefore, zero dispersion for this 3 port geometry is preserved. One of the remaining inlets in FIG. 5 shows a practical package in a tube form.

Figure 6:
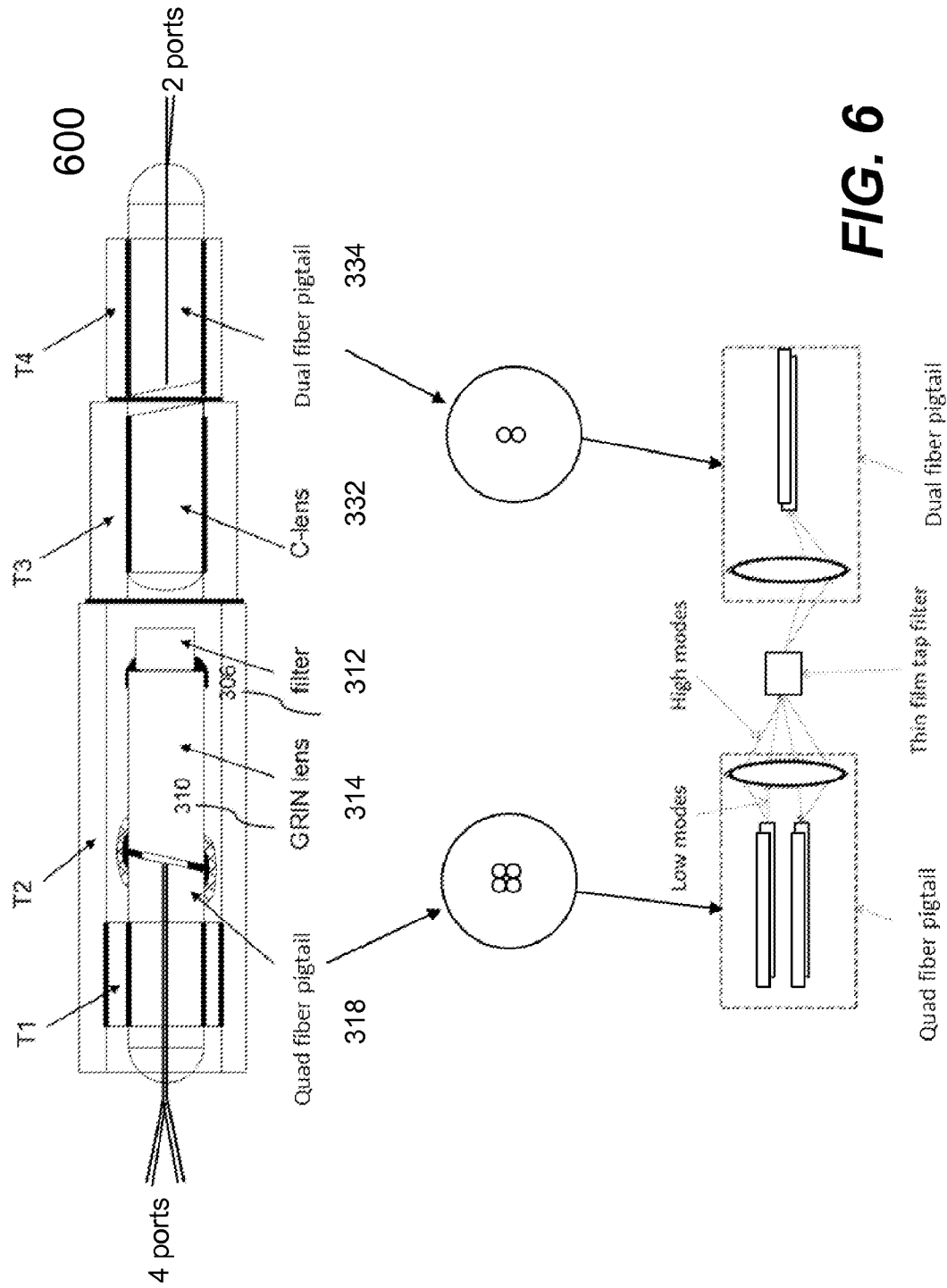
FIG. 6 shows an (integrated) tap filter according to another embodiment of this invention by integrating two single tap filters in one device.

FIG. 6 shows an (integrated) tap filter 600 according to another embodiment of this invention. Owing to the lens and filter based zero dispersion principle, FIG. 6 extends the same principle of 3-port tap into a 6-port tap containing essentially two parallel sets of devices. One of the key components in the device 600 is to use a four-fiber collimator 318 on the reflect side and a dual fiber collimator 314 on the pass side but share the same thin film tap filter 610.

Figure 7:
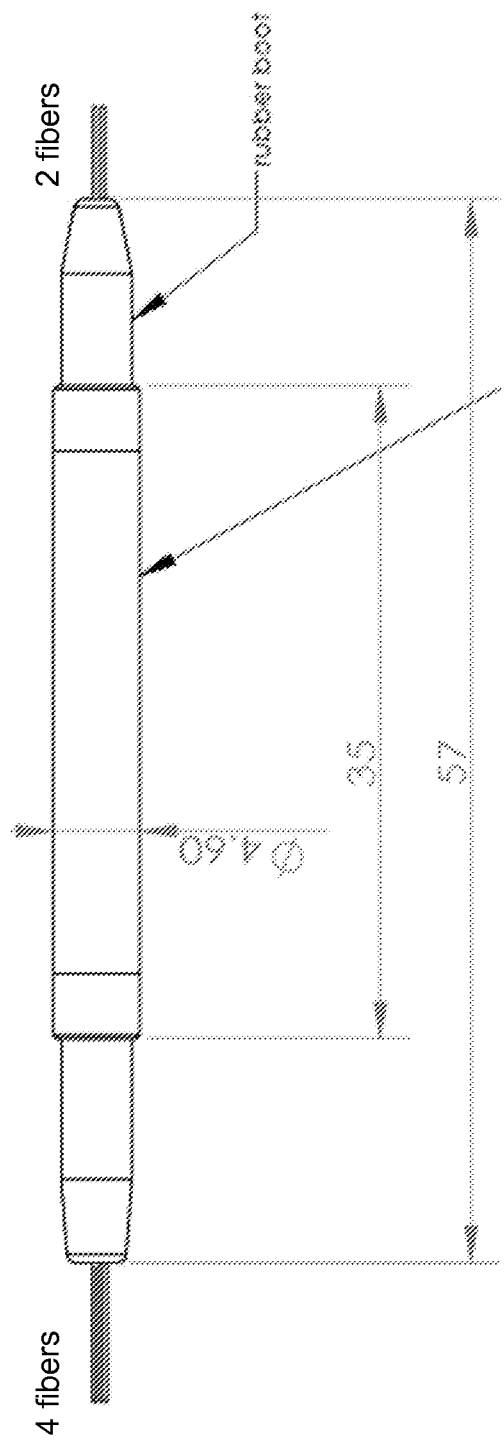
FIG. 7 shows an exemplary 3-port form-factor package that can be used for the tap filter of FIG. 6.

This 2-in-1 package benefits high density routing which data center always requires, since the occupied volume of 2-in-1 is nearly half of a standard single channel. This 2-in-1 package can also reduce the cost of tapping for high speed as the cost of 2-in-1 is ~60% of standard single channel tapping. FIG. 7 shows an exemplary 3-port form-factor package that can be used for the tap filter of FIG. 6.

Figure 8:
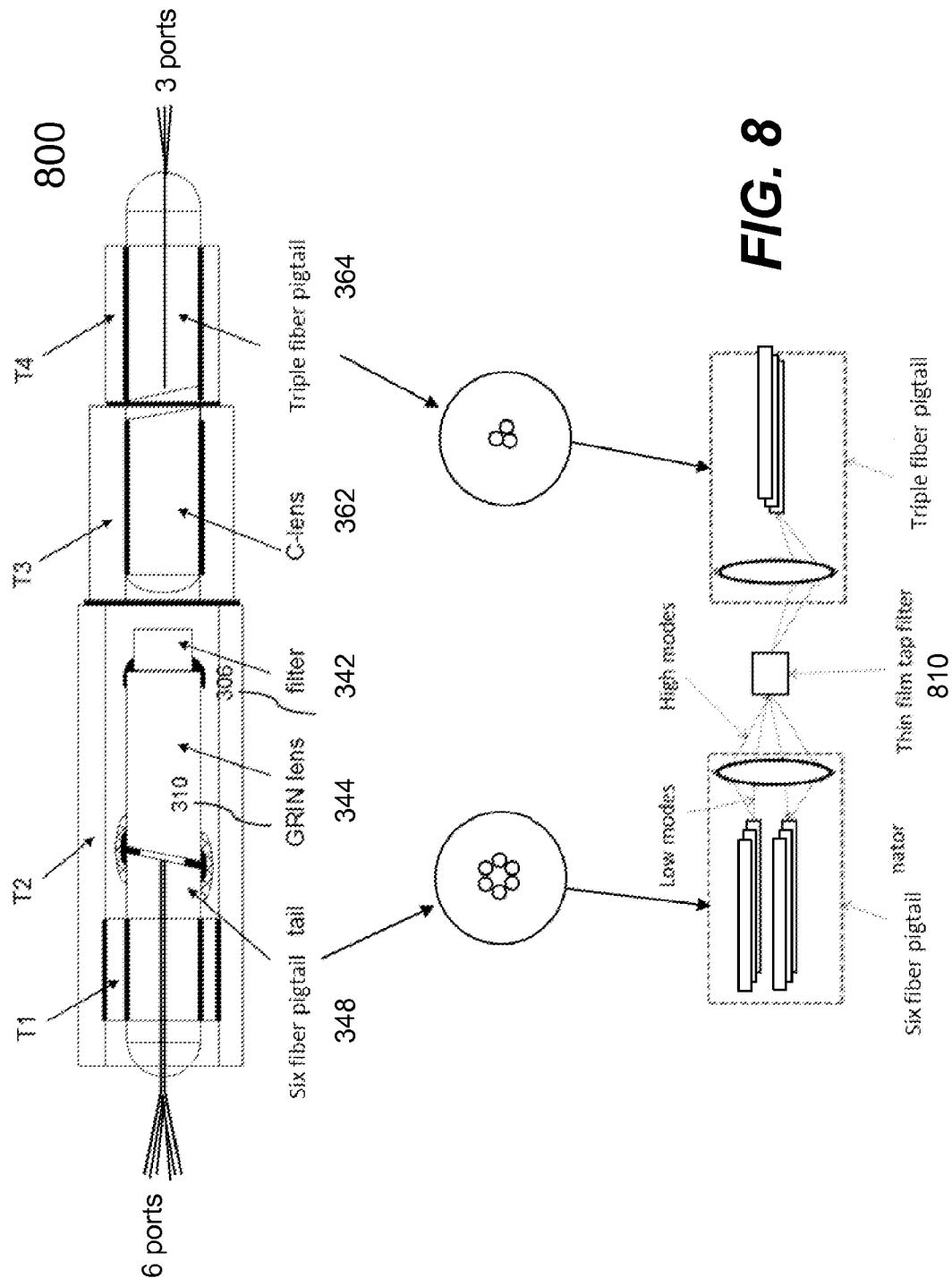
FIG. 8 shows an (integrated) tap filter by integrating three single tap filters in one device.
Figure 9:
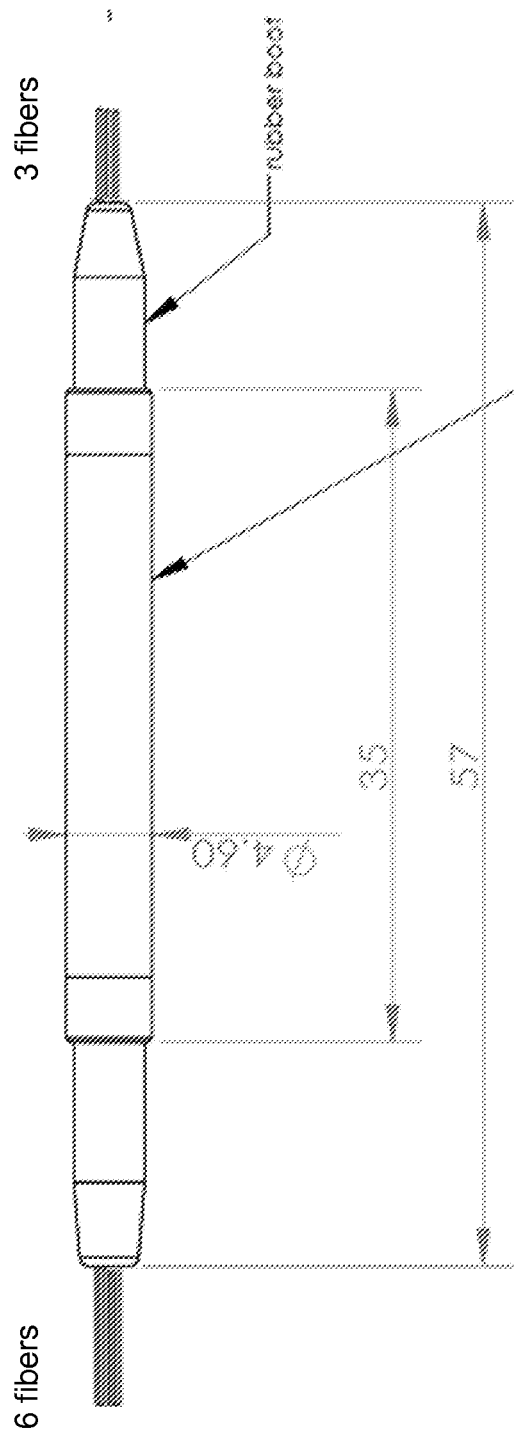
FIG. 9 shows an exemplary 3-port form-factor package that can be used for the tap filter of FIG. 9.

As a further extension, FIG. 8 shows a tap filter 800 by integrating three single tap filters in one device. FIG. 8 extends the same principle of 3-port tap into a 9-port tap containing essentially three parallel sets of devices. The device 800 uses a six-fiber collimator 348 on the reflect side and a triple-fiber collimator on the pass side but shares the same thin film tap filter 810 in the same package of single channel. This 3-in-1 can benefit high density routing further since the volume occupied is nearly ⅓ of single channel. The cost of 3-in-1 is further reduced from 2-in-1 further and is nearly ~40% of standard single channel tapping. FIG. 9 shows an exemplary 3-port form-factor package that can be used for one embodiment of the tap filters being described above.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. For example, the variable neutral density filter may be replaced by another device that can strengthen an optical signal. Accordingly, the scope of the present invention is defined by the appended claims rather than the foregoing description of embodiments.

What we claim is:

1. An optical tap filter package comprising:
    at least two individual optical tap filters working independently with respect to each other and sharing a single thin film tap filter, wherein each of the two individual optical tap filters includes an input port, a tapping port and an output port, the input port and the tapping port are on one side of the film tap filter and the output port is on another side of the film tap filter, wherein the thin film tap filter receives an incoming light signal from the input port of each of the two individual optical tap filters and reflects a predefined potion of the incoming light signal to the tapping port of each of the two individual optical tap filters and pass a remaining portion of the incoming light signal to the output port of each of the two individual optical tap filters.

2. The optical tap filter package as recited in claim 1, wherein the thin film tap filter is designed to keep a ratio of the predefined portion over the remaining portion being less than 50%.

3. The optical tap filter package as recited in claim 1, further comprising: a first collimator, a lens system and a second collimator, wherein the at least two individual optical tap filters function independently but share the first collimator, the lens system and the second collimator.

4. The optical tap filter package as recited in claim 2, wherein the first collimator supports all fibers supporting the input port and the tapping port of the at least two individual optical tap filters, and the second collimator supports all fibers supporting the output port of the at least two individual optical tap filters.

5. The optical tap filter package as recited in claim 4, wherein the first collimator is a quad collimator when there are only two individual optical tap filters packaged in the optical tap filter package.

6. The optical tap filter package as recited in claim 5, wherein the second collimator is dual collimator.

7. The optical tap filter package as recited in claim 4, wherein the first collimator is a hex collimator when there are three individual optical tap filters packaged in the optical tap filter package.

8. The optical tap filter package as recited in claim 7, wherein the second collimator is a triple collimator.

9. The optical tap filter package as recited in claim 1, wherein the optical tap filter package is in form of 3-port form factor.

* * * * *